(12) United States Patent
Nakazima

(10) Patent No.: US 7,458,139 B2
(45) Date of Patent: Dec. 2, 2008

(54) TIP DRESSER

(75) Inventor: Kotaro Nakazima, Nagoya (JP)

(73) Assignee: Kyokutoh Co., Ltd, Nagoya, Aichi (JP)

( * ) Notice: Subject to any disclaimer, the term of this patent is extended or adjusted under 35 U.S.C. 154(b) by 0 days.

(21) Appl. No.: 11/858,227

(22) Filed: Sep. 20, 2007

(65) Prior Publication Data

US 2008/0075551 A1 Mar. 27, 2008

(51) Int. Cl.
- B23P 23/04 (2006.01)
- B23P 6/00 (2006.01)
- B23C 3/12 (2006.01)
- B23C 1/00 (2006.01)

(52) U.S. Cl. .............. 29/33 R; 29/402.19; 409/140; 219/119; 72/126; 451/65

(58) Field of Classification Search ............ 29/33 K, 29/33 R, 402.19; 409/137, 138, 139, 140; 219/119; 72/126; 451/65, 68

See application file for complete search history.

(56) References Cited

U.S. PATENT DOCUMENTS

| | | | | |
|---|---|---|---|---|
| 4,892,448 A | * | 1/1990 | Hoch et al. | 409/181 |
| 4,966,504 A | * | 10/1990 | Seme et al. | 409/140 |
| 4,966,506 A | * | 10/1990 | Slanker | 409/140 |
| 5,332,342 A | * | 7/1994 | Kizaki et al. | 409/140 |
| 5,401,127 A | * | 3/1995 | Nakajima et al. | 409/181 |
| 5,993,125 A | * | 11/1999 | Shimada | 409/140 |
| 6,049,053 A | * | 4/2000 | Shimada | 219/86.1 |
| 6,195,860 B1 | * | 3/2001 | Di Rosa et al. | 29/33 R |
| 6,518,537 B1 | * | 2/2003 | Tezawa | 29/402.19 |
| 7,192,227 B2 | * | 3/2007 | Nordstrom et al. | 409/140 |
| 7,257,872 B2 | * | 8/2007 | Shim | 29/33 K |

* cited by examiner

Primary Examiner—Dana Ross
(74) Attorney, Agent, or Firm—Occhiuti Rohlicek & Tsao LLP

(57) ABSTRACT

A tip dresser is disclosed, by which a cutter body can be easily formed and by which an end of an electrode tip can be quickly and neatly grinded. A tip dresser, which is configured to grind a pair of electrode tips used for spot welding in a manner of approaching ends of a pair of the electrode tips to each other, includes a cutter including a holder configured to be rotationally driven with a rotation center axis matched to an axial center of each of the mutually approached electrode tips, a cutter body retained by the holder to cut vicinities of the ends of electrode tips in case the holder is rotated.

3 Claims, 9 Drawing Sheets

TIP DRESSER

CROSS-RELATED APPLICATIONS

This application claims the benefit of Japanese Patent Application No. 2006-257482, filed on Sep. 20, 2006. The contents of which is hereby incorporated by reference in its entirety.

BACKGROUND OF THE INVENTION

1. Field of the Invention

The present invention relates to a tip dresser. Although the present invention is suitable for a wide scope of applications, it is particularly suitable for grinding a pair of electrode tips used for spot welding.

2. Discussion of the Related Art

Generally, a cotter of a tip dresser according to a related art is configured to be stretched out in four directions from a rotation center axis. And, the tip dresser is configured to include a cutting blade provided to an edge of an end portion of a side according to each direction of the rotation center axis. So, the related art tip dresser is capable of grind each electrode tip in forward or reverse revolution (e.g., of. Japanese Patent No. 3,738,432).

However, since the cutter of the related art tip dresser is not configured to have a plate shape, it is unable to manufacture the tip dresser by a simple cutting process for cutting a portion of a metal material of a flat panel. Moreover, processing for increasing an amount of casting or cutting is necessary to manufacture the related art tip dresser. So, it is difficult to manufacture the tip dresser.

SUMMARY OF THE INVENTION

Accordingly, the present invention is directed to a tip dresser that substantially obviates one or more problems due to limitations and disadvantages of the related art.

An object of the present invention is to provide a tip dresser, by which a cutter body can be easily formed.

Another object of the present invention is to provide a tip dresser, by which an end of an electrode tip can be quickly and neatly grinded.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a tip dresser according to the present invention is configured to grind a pair of electrode tips used for spot welding in a manner of approaching ends of a pair of the electrode tips to each other and includes a cutter including a holder configured to be rotationally driven with a rotation center axis matched to an axial center of each of the mutually approached electrode tips, a cutter body retained by the holder to cut vicinities of the ends of electrode tips in case that the holder is rotated, the cutter body configured to cut the vicinities of the electrode tips in case of forward or reverse revolutions of the holder, and a discharge hole perforated between the cutter body and the holder along the rotation center axis to discharge cutting particles generated from grinding the ends of the electrode tips, wherein the cutter body further includes a pair of accommodating concave parts provided to both edges in a length direction approximate to a direction of approaching a pair of the electrode tips to each other to accommodate the ends of the electrode tips in case of grinding a pair of the electrode tips aligned to oppose each other, respectively, wherein the cutter body further includes a pair of recesses configuring a pair of the accommodating concave parts, respectively, wherein the cutter body further includes a pair of plate type cutting blade parts, each having a cutting blade at one edge in a direction of a plate thickness becoming a circumferential edge of the corresponding recess, a pair of the plate type cutting blade parts assembled in an approximate cross shape to cross with each other in the vicinity of the rotation center axis, wherein a crossing point between the cutting blades is located on the rotation center axis, wherein if the holder is rotated in a forward direction, a portion of one of the cutting blades aligned to spread from the crossing point and a portion of the other cutting blade aligned distant from the crossing point cut the electrode tips, and wherein if the holder is rotated in a reverse direction, a portion of the other cutting blade aligned to spread from the crossing point and a portion of the former cutting blade aligned distant from the crossing point cut the electrode tips.

In the tip dresser according to the present invention, since the cutter body retained by the holder is configured so have an approximate cross shape including a pair of the plate type cutting blade parts crossing with each other, it is able to form each of the plate type cutting blade parts in a manner of cutting a flat panel type metal material into a plate type cutting blade member having a prescribed shape using a wire cutter and simultaneously forming a cutting blade portion. And, it is able to manufacture the cutter body by assembling the plate type cutting blade parts together at an assembling portion. Hence, compared to the related tip dresser, the tip dresser according to the present invention is able to reduce a cutting amount and facilitates the cutter body to be formed.

In the tip dresser according to the present invention, a pair of the electrode tips can be grinded by rotating the holder in a forward or reverse direction without restricting a rotational direction of the holder. For instance, after a pair of the electrode tips have been grinded by the cutting blades in a manner of rotating the holder in the forward direction, if electrode tips of a next set are grinded by rotating the holder in the reverse direction, even if cutting particles or powder is attached to the cutting blades, they can be easily detached from the cutting blades.

In the tip dresser according to the present invention, the cutting blades provided to the cutter body are configured to spread in a1 directions in the vicinity of the rotation center axis. When the holder is rotated in the forward or reverse direction, the electrode tip is cut using two neighboring portions of the corresponding cutting blades and supported by the rest two portions. In the tip dresser according to the present invention, when the electrode tips are grinded, the electrode tips can be supported by the four portions of the cutting blades spreading in four directions from the vicinity of the rotation center axis. Hence, the present invention can restrain the electrode tips from shaking or rocking in the coarse of grinding the electrode tips.

In the tip dresser according to the present invention, even if the holder is rotated in the forward or reverse direction, the corresponding electrode tip is cut using the two portions of the cutting blade. Hence, the present invention is able to quickly grind the end of the corresponding electrode tip.

Therefore, the tip dresser according to the present invention facilitates the manufacturing of the cutter body and enables the ends of the electrode tips to be quickly and neatly grinded.

Preferably, the cutter body includes a pair of cutting blade plate members configuring the plate type cutting blade parts to have fitting recesses, respectively. And, the fitting recesses are fitted together at a crossing point between a pair of the cutting blade plate members. Moreover, a pair of the cutting blade plate members are assembled together in a manner of fitting the fitting recesses of a pair of the cutting blade plate members to each other.

Preferably, the cuter body includes a cutting blade main member configuring one of the plate type cutting blade parts and a pair of cutting blade sub-members configuring to divide the other plate type cutting blade part into two parts in the vicinity of the rotation center axis. And, each of a pair of the cutting blade sub-members is assembled to the cutting blade main member in a manner that a fitting portion provided to the corresponding cutting blade sub-member in the vicinity of the rotation center axis and another fitting portion provided to the cutting blade main member are fitted into each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

EMBODIMENT

One embodiment of the present invention is explained with reference to the accompanying drawings as follows.

Figure 1:
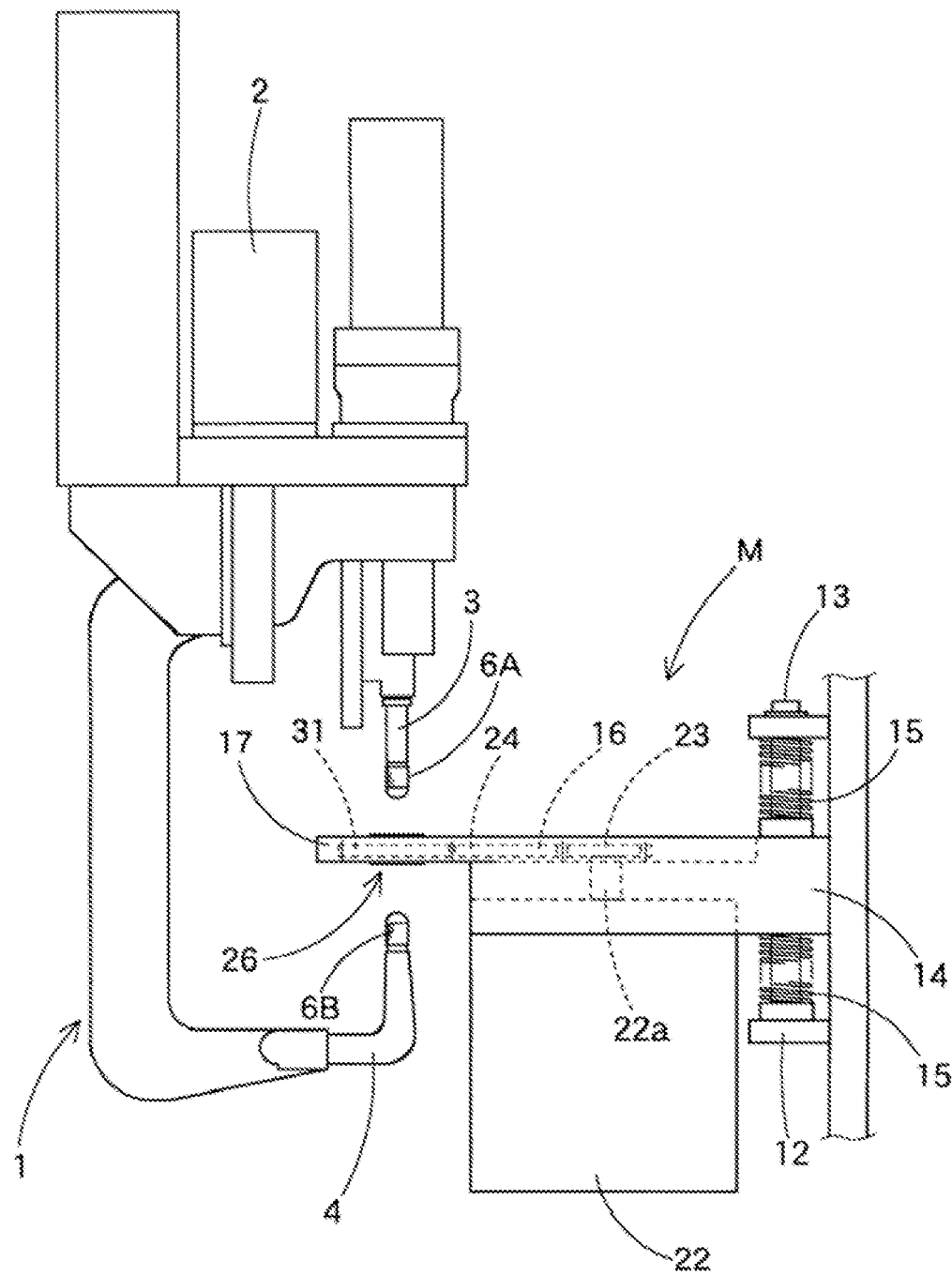
FIG. 1 is a perspective diagram of a tip dresser according to one embodiment of the present invention.
Figure 2:
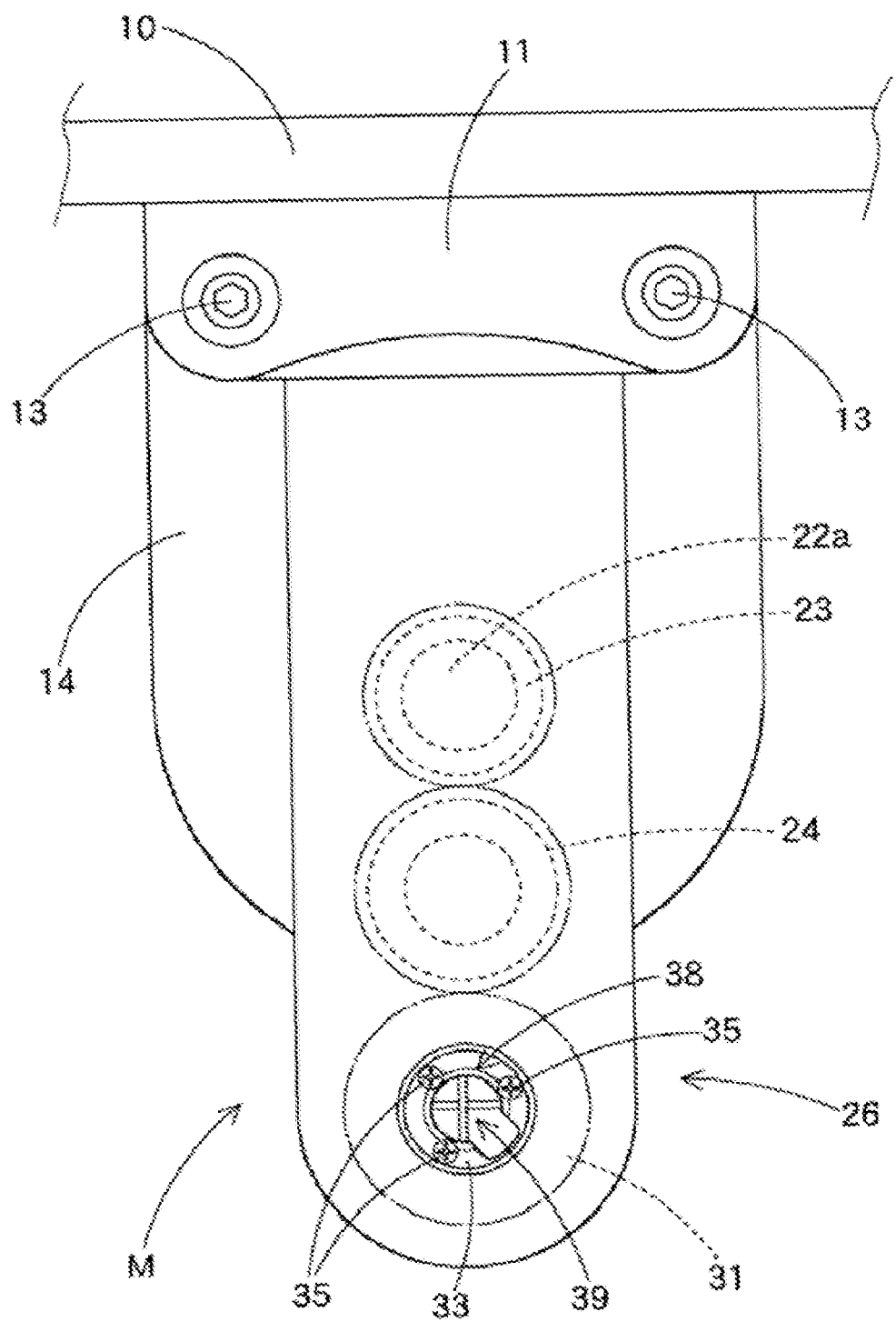
FIG. 2 is a schematic layout of a tip dresser according to one embodiment of the present invention.

First of all, a tip dresser M according to one embodiment of the present invention, as shown in FIG. 1 and FIG. 2, grinds a par of electrode tips 6A and 6B respectively fitted into a pair of shanks 3 and 4 of a welding gun 1.

The welding gun 1 includes a servo gun retained by an end of an arm of a multi-joint welding robot (not shown in the drawings). In this case, the servo gun 1 includes a regular one that and is retained to move a pair of the electrode tips 6A and 6B by a servo motor 2 having a built-in encoder.

And, the servo gun 1 is configured to have a position control function for enabling a pair of the electrode tips 6A and 6B to approach to each other.

Moreover, the servo gun 1 is provided with a logical operation function to control a count of revolutions or the servo motor 2 and torque thereof. And, the servo gun 1 is capable of controlling positions or pressurizations of the electrode tips 6A and 6B.

Each of the electrode tips 6A and 6B includes a circular end face 6a provided to an end side coming into contact with a device in performing welding and a diameter extending portion 6c extending in diameter from an edge (angled portion) 6b of the end face 6a to a cylindrical support portion 6d.

Figure 3:
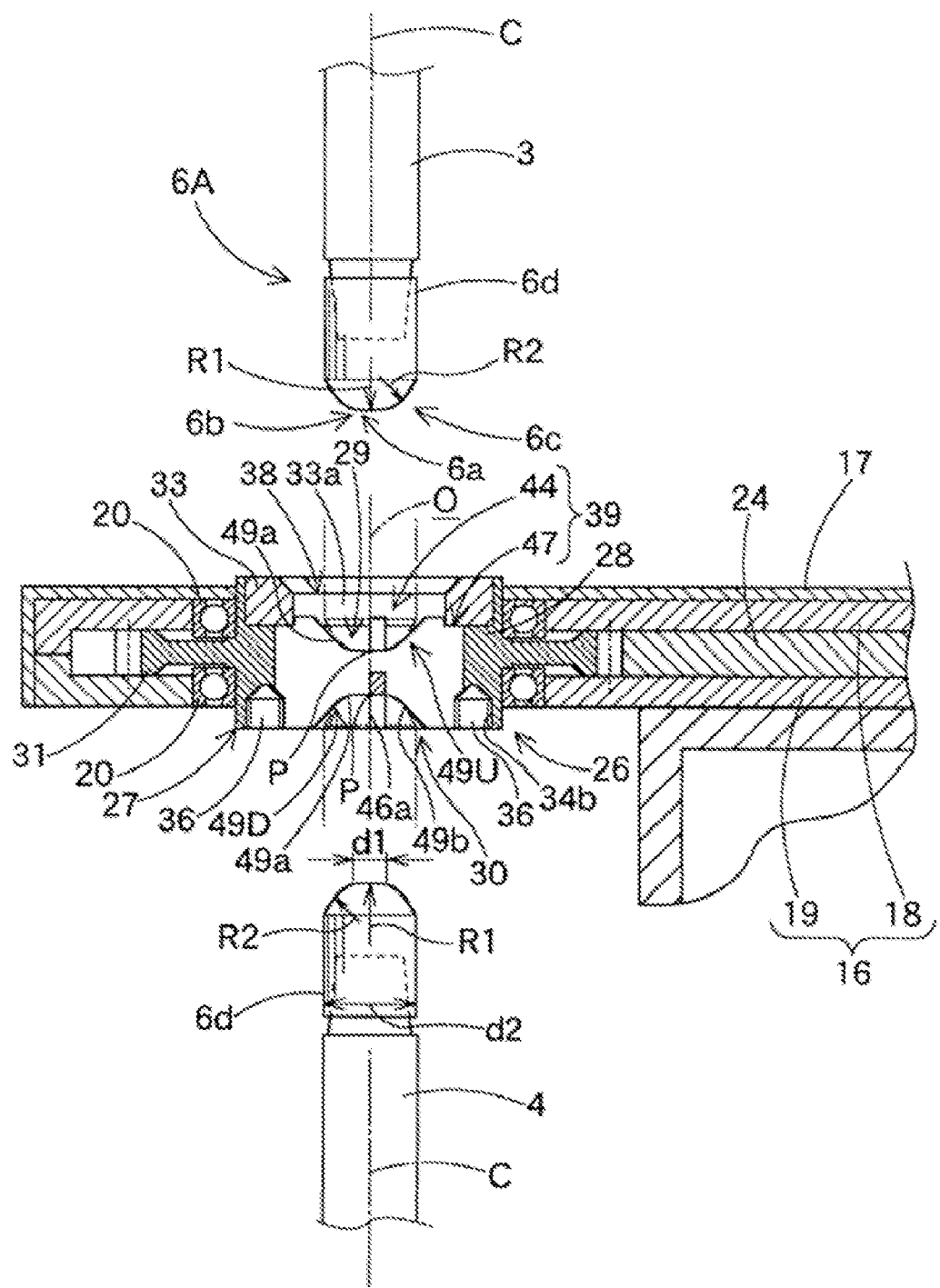
FIG. 3 is a schematic cross-sectional diagram of major elements of a tip dresser according to one embodiment of the present invention.

In the present embodiment, the end face 6a has an approximately flat spherical shape with a radius R1 of 40 mm, the diameter extending portion 6c has a spherical shape with a radius R2 of 8 mm, a diameter d1 of the end face 6a is 6 mm, and a diameter d2 of the support portion 6d is 16 mm (cf. FIG. 3).

The tip dresser M is installed within a movable range of the servo gun 1 by the operation of the welding robot. And, the tip dresser M, as shown in FIG. 1 and FIG. 2, includes a support frame 10, a guide block 14, a gear case 16, a driving motor 22, and a dresser body 26 configuring a cutter.

Brackets 11 and 12 are vertically provided to the support frame 10 installed within the movable range of the servo gun 1.

Guide rods 13 are provided to right and left portions of the upper and lower brackets 11 and 12 to penetrate vertically.

The guide block 14 is horizontally provided to an approximately middle position of each of the guide rods 13 to slide upward or downward along an axial direction of the corresponding guide rod 13 from a position toward the support portion.

Four compression coil springs 15, in which the corresponding guide rods 13 are inserted, are contacted with upper and lower surfaces of the guide block 14. By the expansion and contraction of the springs 15, the guide block 14 can be movably supported by the support frame 10 according to the movements of the electrode tips 6A and 6B in an axial direction, The gear case 16 including upper and lower plates 18 and 19 are provided to an end side of the guide block 14. A gear wheel part 31 is provided between the plates 18 and 19 of the end side to be provided to the dresser body 26 with bearings 20 and 20 in-between. In this case, topside or lateral side of the upper plate 18 is covered with a cover 17.

The driving motor 22 is provided under the support portion of the gear case 16 to rotationally drive a holder 27. A driving shaft 22a of the driving motor 22 is provided with a gear 23 that is engaged with another gear 24. And, the gear wheel part 31 of the dresser body 26 is engages with the latter gear 24.

The dresser body 26 configuring the cutter, as shown in FIG. 2, includes the holder 27 and the cutter body 39 retained by the holder 27.

In particular, the holder 27 includes a drum shape part 28 having an approximately cylindrical shape and the gear wheel part 31 projected in a disk shape from an outer circumference of the drum shape part 28 to be engaged with the gear 24.

The holder 27 is installed in a manner that a driving force of the driving motor 22 is transferred via the gears 23 and 24 and the gear wheel part 31 to enable a rotation center axis O to coincide with a shaft center C of each of the electrode tips 6A and 6B in the course of grinding.

The holder is rotatably supported by the gear case 16 in a manner that the bearings 20 and 20 are provided to the outer circumference of the drum shape part 28 to leave the gear wheel part 31 in-between.

A rotational direction of the holder 27 is a circumferential direction (shaft rotation direction) of the shaft center C of each of the electrode tips 6A and 6B in the course of grinding. And, the holder 27 enables forward and reverse rotations. In the present embodiment, in case of forward rotations, as shown in FIG. 7, the holder 27 rotates counterclockwise in a horizontal direction.

Figure 4:
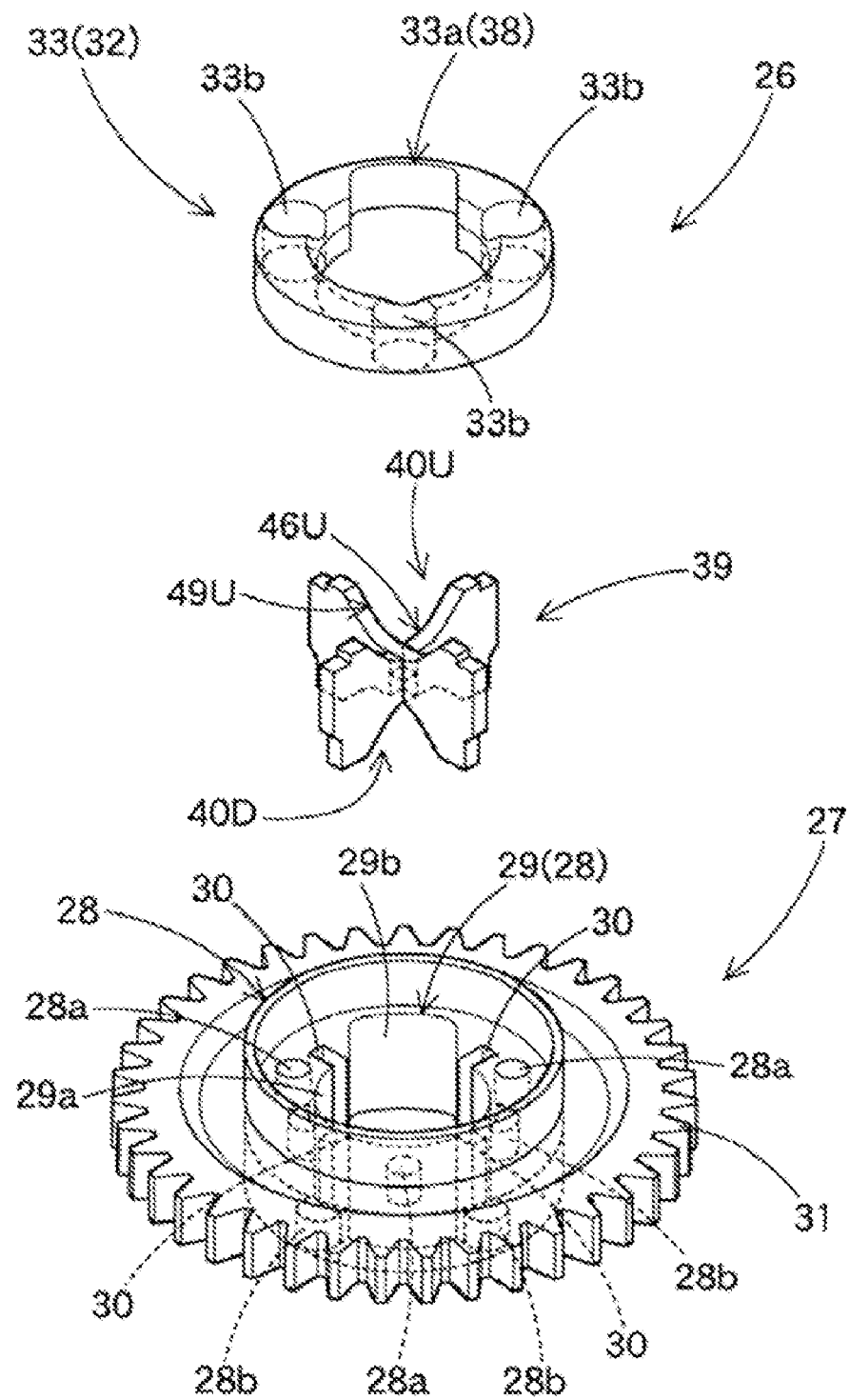
FIG. 4 is an exploded perspective diagram of a cutter body and a rotation base in a tip dresser according to one embodiment of the present invention.
Figure 7:
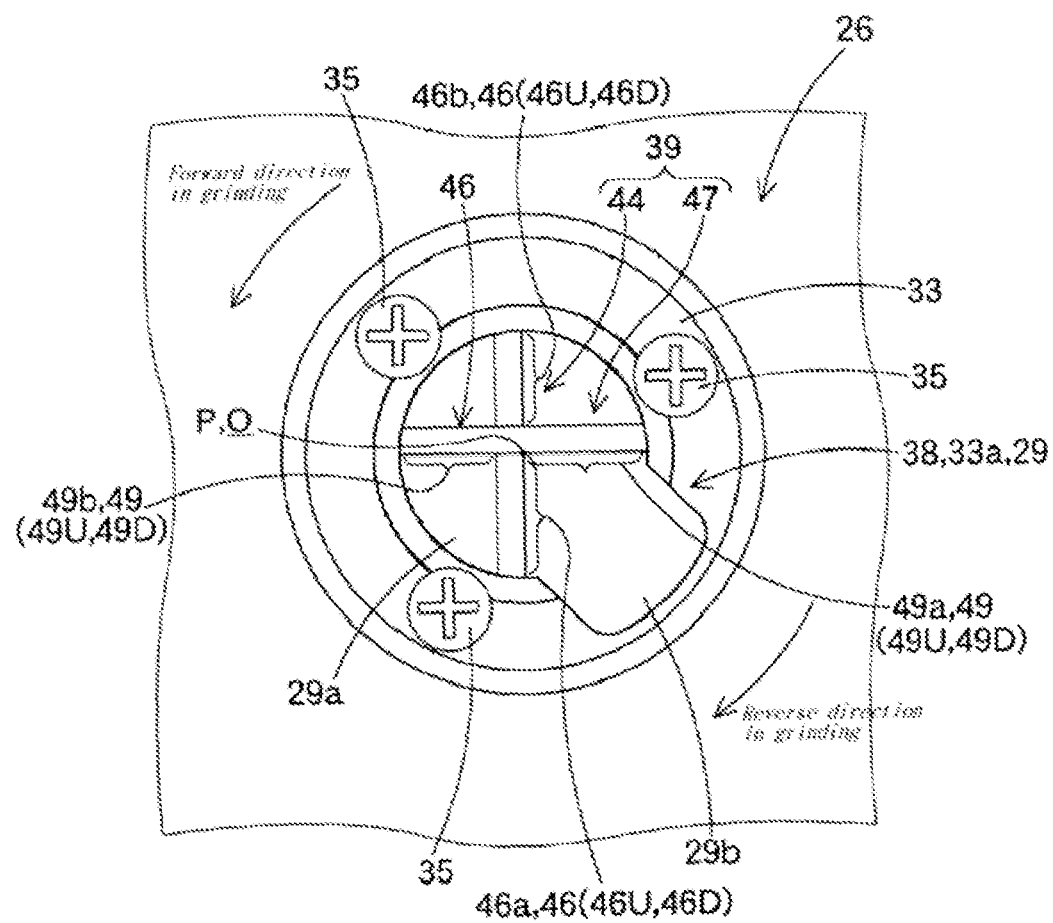
FIG. 7 is an enlarged diagram of a cutter portion of a tip dresser according to one embodiment of the present invention.

Referring to FIG. 4 and FIG. 7, a perforated hole 29 is formed at a center of the drum shape part 28. The perforated hole 29 is configured to have a circular cross-section and a rectangular cross-section combined with the circular cross-section. And, the perforated hole 29 is configured to vertically perforate the drum shape part 28.

In particular, the perforate hole 29 includes a perforated hole body 29a having a center coincide with the rotation center axis O, the perforated hole body 29a configured to have an approximately circular cross-section and a discharge hole portion 29b having an approximately rectangular cross-section between main cutting portions 46a and 49a on a circumference edge of the perforated hole body 29a to increase an opening area between the main cutting portions 46a and 49a of cutting blades 46 and 49 of the cutter body 39.

Fitting recess portions 30, each of which has an approximately rectangular cross-section to enable an end portion (end of plate type cutting blade part 44 or 47 in a width direction D3 or D4) of the cutter body 39 to be fitted therein, are provided to four portions of the circumference of the perforated hole body 29a to form an approximately radial formation in a vertical direction across the entire area of the perforated hole body 29a centering on the rotation center axis O, respectively.

Three screw holes 28a are formed at topside of the drum shape part 28 to lock screws 35 therein, respectively.

And, other screw holes 28b are provided to lower portions of the drum shape part 28 under the fitting recess portions 30 to enable the bottom side of the cutter body 39 to be retained by the drum shape part 28, respectively.

In this case, each of the latter screw holes 28b is configured to be connected to the corresponding fitting recess portion 30. So, a taper face portion 44a/47a of the plate type cutting blade part 44/47, which becomes a lower face of the cutter body 39, comes into contact with an end of the corresponding screw 36, whereby the cutter body 39 can be retained by the drum shape part 28.

An upper cover 33 is provided to a topside of the drum shape part 28. The upper cover 33 covers the topside of the cutter body 39 to enable the cutter body 39 to be retained by the drum shape part 28.

The upper cover 33, as shown in FIG. 4, is configured to have an approximately disk shape. And, an insertion hole 33a is formed at a center of the upper cover 33 to correspond to the perforated hole 29 of the drum shape part 28.

And, connecting holes 33b are formed at three portions of an outer circumference of the upper cover 33. So, the screws 35 (cf. FIG. 2 and FIG. 7) for fixing the upper cover 33 to the drum shape part 28 can be inserted in the connecting holes 33b, respectively.

In the dresser body 26 of the present embodiment, the cutter body 39 is configured to be retained by the drum shape part 28 in a manner of fitting the end portions (i.e., both end portions of the plate type cutting blade parts 44 and 47 in width directions D3 and D4) of the cutter body 39 into the fitting recess portions 30 provided to the drum shape part 28, pressing the topside of the cutter body 39 by the upper cover 33 fixed to the drum shape part 28 using the screws 35, and pressing the bottom side of the cutter body 39 using the screws 36.

In the dresser body 26 of the present embodiment, the perforated hole 29 provided to the drum shape parts 28 and the insertion hole 33a of the upper cover 33 configure a discharge hole 38 for discharging particles or power generated from grinding the ends of the electrode tips 6A and 6B.

Figure 5:
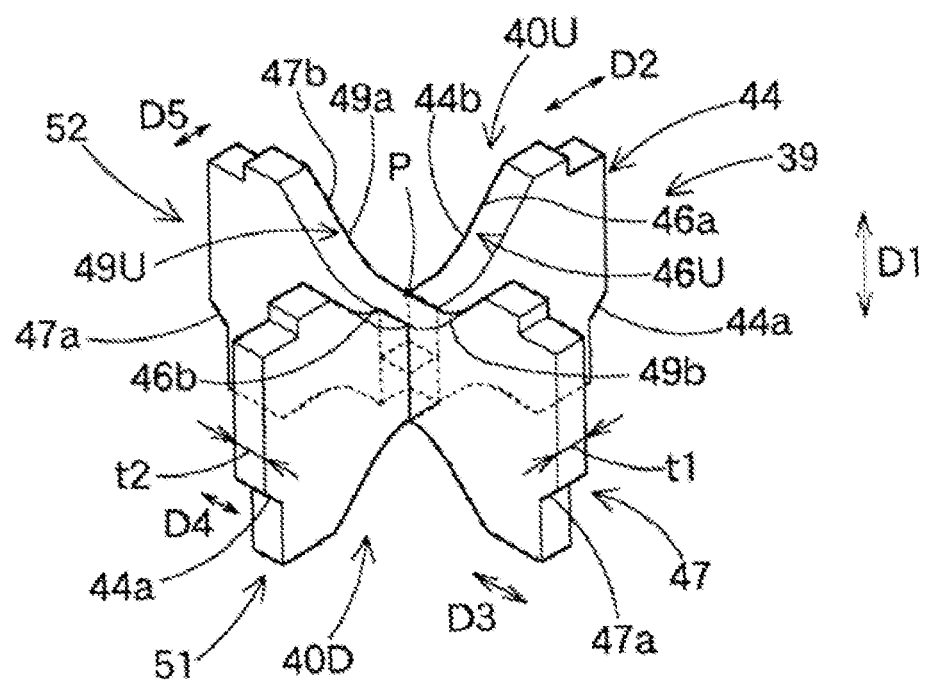
FIG. 5 is a perspective diagram of a cutter body of a tip dresser according to one embodiment of the present invention.
Figure 6:
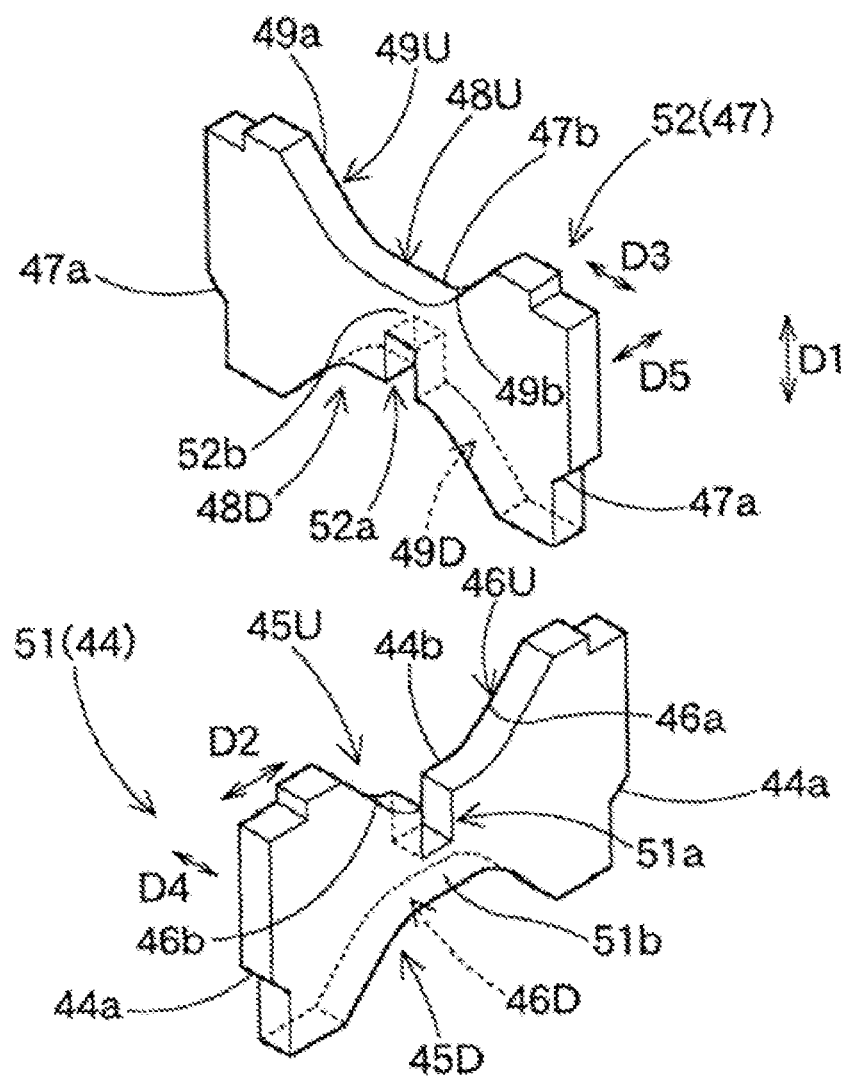
FIG. 6 is an exploded perspective diagram of a cutting blade board configuring the cutter body shown in FIG. 5.

The cutter body 39, as shown in FIG. 5 and FIG. 6, includes a pair of the plate type cutting blade parts 44 and 47 in a shape approximate to a double-headed drum pinched in at the middle. The plate type cutting blade part 44/47 is configured, to have a pair of indented portions 45U and 45D/48U and 46D at upper and lower sides in a length direction D1. And, a pair of the plate type cutting blade parts 44 and 47 are installed to cross with each other in the vicinity off the rotation center axis O. The indented portions 45u, 45D, 48U and 48D of the plate type cutting blades 44 and 47 provided to both of the edges thereof in the length direction D1 of the cutter body 39 configure a pair of accommodating concave parts 40U and 40D for accommodating ends of the electrode tips 6A and 6B, respectively.

The tape face portions 44a and 47a are provided to lower ends portions of both ends of the plate type cutting blade parts 44 and 47 in the width directions D2 and D3 to come into contact with ends of the screws 36 enabling the cutter body 39 to be retained by the dram shape part 28, respectively.

The plate type cutting blade part 44/47 is configured to have cutting blades 46U and 46D/49U and 49D provided to edges portion 44b/47b becoming circumferential edges of the indented portions 45U and 45D/48U and 48D in a plate thickness direction D4/D5.

In the present embodiment, the cutting blades 46U/46D and 49U/49D are configured to grind the corresponding electrode tip 6A/6B in a manner of setting a rake angle to about 3° while the holder 27 is rotating.

In the cutter body 39 of the present embodiment, to locate a crossing point P between the cutting blades 46U and 46D or between the cutting blades 49U and 49D at the rotation center axis O, the plate type cutting blade parts 44 and 47 are configured to cross with each other at a point slightly deviating from centers of the width directions D3 and D4, respectively.

In the cutting blades 46U, 46D, 49U and 49D of the present embodiment, portions 46a and 49a at the same side extend from the crossing point P to configure a main cutting part for cutting the corresponding electrode tip 6A/6B, whereby an end face 6a, an edge portion of the end face 6a, and a diameter extending portion 6c of the corresponding electrode tip 6A/6B can be cot and grinded, In the cutting blades 46U, 46D, 49U and 49D of the present embodiment, portions 46b and 49b provided distant from the crossing point P configure an auxiliary cutting part for cutting the corresponding electrode tip 6A/6B, whereby the diameter extending portion 6c of the corresponding electrode tip 6A/6B can be cut and grinded only.

In the present embodiment, a plate thickness t1/t2 of the plate type cutting blade part 44/47 is set to 3.15 mm (cf. FIG. 5).

In the cutter body 33 of the present embodiment, the main cutting portion 46a of the each of the cutting blades 46U and 46D and the auxiliary cutting portion 49b of each of the cutting blades 49U and 49D can cut the electrode tips 6A and 6B in case of the forward rotation of the holder 27. And, the main cutting portion 49a of the each of the cutting blades 49U and 49D and the auxiliary cutting portion 46b of each of the cutting blades 46U and 46D can cut the electrode tips 6A and 6B in case of the reverse rotation of the holder 27.

In the present embodiment, the cutter body 39, as shown in FIG. 6, includes a pair of cutting blade plates 51 and 52 respectively configuring the plate type cutting blade parts 44 and 47.

Each of the cutting blade plates 51 and 52 is configured to have a shape approximate to a double-headed drum pinched in at the middle. In this case, each of the cutting blade plates 51 and 52 is formed by cutting a flat panel metal material such as high-speed tool steel using a wire cutter.

In the vicinity of the center of the cutting blade plate 51 configuring the plate type cutting blade part 44 in the width direction D2, a fitting recess 51a is formed by cutting an upper edge into an approximately rectangular shape to enable a middle portion 52b of the other cutting blade plate 52 to be fitted therein. In the vicinity of the center of the cutting blade plate 52 configuring the plate type cutting blade part 47 in the width direction D3, a fitting recess 52a is formed by cutting a lower edge into an approximately rectangular shape to enable a middle portion 51b of the other cutting blade plate 51 to be fitted therein.

And, the cutter body 39 of the present embodiment is configured by fitting the cutting blade plates 51 and 52 into the fitting recesses 51a and 52a, respectively.

An operational use of the tip dresser M according to one embodiment of the present invention is explained as follows.

First of ail, after a predetermined count of spot welding has been performed, the welding robot aligns the servo gun 1 in the vicinity of the tip dresser M and simultaneously aligns the electrode tips 6A and 6B in a vertical direction to oppose each other by leaving the dresser body 26 in-between. If so, the tip dresser M activates the driving motor 22 correspondingly.

The servo gun 1 is activated to approach the electrode tips 6A and 6B toward each other to be pushed into the accommodating concave parts 40U and 40D of the cutter body 39, respectively. If so, the cutter body 39 can cut the electrode tips 6A and 6B using the main cutting portions 46a of the cutting blades 46U and 46D and the auxiliary cutting portions 49b of the cutting blades 49U and 49D.

In the tip dresser M of the present embodiment, since the cotter body 39 retained by the holder 27 is configured to have an approximately cross shape including a pair of the plate type cutting blade parts 44 and 47 crossing with each other, the fitting recesses 51a and 52b are formed as assembly portions in a manner that a flat panel metal material is out into a plate type cutting blade material having a prescribed shape using a wire carter. Simultaneously, the cutting blade plates 51 and 52 configuring the plate type cutting blade parts 44 and 47 can be formed by forming the cutting blades 46U, 46D, 49U and 49D. Subsequently, the cutting blade plates 51 and 52 are assembled together through the fitting recesses 51a and 52a as the assembly portions, whereby the cutter body 39 can be provided. Hence, compared to the related art tip dresser, the tip dresser according to the present invention can reduce a cutting amount and facilitates the manufacturing of the cutter body 39.

In the tip dresser M of the present embodiment, since the cutting blades 46U, 46D, 49U and 49D provided to the cutter body 39 include the main cutting portion 46a and the auxiliary cutting portion 49b for cutting the electrode tips 6A and 6B in case of the forward revolution of the holder 27 and the main cutting portion 49a and the auxiliary cutting portion 46b for cutting the electrode tips 6A and 6B in case of the reverse revolution of the holder 27, a pair of the electrode rips 6A and 6B can be grinded by rotating the holder 27 in a forward or reverse direction without restricting the rotational direction of the holder 27.

In the tip dresser M of the present embodiment, after a pair of the electrode tips 6A and 6B have been grinded by the main cutting portion 46a and the auxiliary cutting portion 49b of the cutting blades 46U, 46D, 49U and 43D by rotating the holder 27 counterclockwise, if electrode tips of a next set are grinded, the electrode tips are grinded by the main cutting portion 49a and the auxiliary cutting portion 46b of the cutting blades 46U, 46D, 49U and 49D by rotating the holder 27 clockwise (i.e., reverse direction), even if cutting particles or powder are attached to the main cutting portion 46a and the auxiliary cutting portion 49b of the cutting blades 46U, 46D, 49U and 49D, they can be simply detached from the main cutting portion 46a and the auxiliary cutting portion 49b of the cutting blades 46U, 46D, 49U and 49D.

In the tip dresser M of the present embodiment, since the main cutting portions 46a and 49a and the auxiliary cutting portions 46b and 49b of the cutting blades 46U, 46D, 49U and 49D provided to the cutter body 39 are configured to spread in four directions from, the vicinity of the rotation center axis O, in case that the holder 27 is rotated in forward direction, the electrode tips 6A and 6B are cut using the neighboring main and auxiliary cutting portions 46a and 49b of the four portions 46a, 46b, 49a and 49b of the cutting blades 46U, 46D, 49U and 49D while the electrode tips 6A and 6B are supported by the rest main and auxiliary cutting portions 49a and 46b.

On the contrary, in case that the holder 27 is rotated in reverse direction, the electrode tips 6A and 6B are cut using the neighboring main and auxiliary cutting portions 49a and 46b while the electrode tips 6A and 6B are supported by the rest main and auxiliary cutting portions 46a and 49b.

In particular, when the electrode tips 6A and 6B are grinded, since the electrode tips 6A and 6B are stably supported by the four portions 46a, 46b, 49a and 49b of the cutting blades 46U, 46D, 49U and 49D extending in four direction from the vicinity of the rotation center axis O, it is able to restrain the electrode tips 6A and 6B from shaking in case of being grinded.

In the tip dresser M of the present embodiment, since the electrode tips 6A and 6B are cut using two portions 46a and 49b /49a and 46b of the cutting blades 46U, 46D, 49U and 49D in case of the forward or reverse revolution, ends of the electrode tips 6A and 6B can be quickly grinded.

Hence, the tip dresser M according to the embodiment of the present invention can grind the ends of the electrode rips 6A and 6B can be quickly and neatly grinded. And, the cutter body 39 can be easily manufactured.

In the tip dresser M of the present embodiment, the cutter body 39 is configured to approximately have a cross shape including a pair of the plate type cutting blade parts 33 and 47 crossing with each other. The plate type cutting blade part 44/47 is configured to be retained by the drum shape part 28 in a manner of pressing both of the bottom edges in the width direction D3/D4 using the screws 36. Hence, the cutter body 39 can be stably retained by the drum shape part 28 by the screws 36 without shaking or rocking.

In the present embodiment, the cutter body 39 is configured with a pair of the cutting blade plates 51 and 52.

Figure 8:
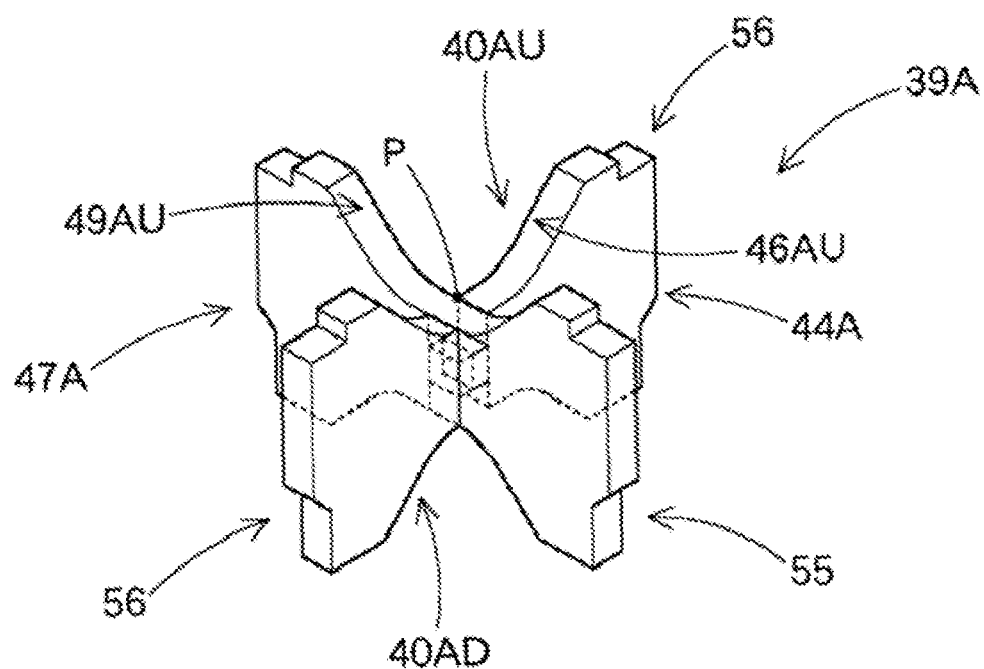
FIG. 8 is a perspective diagram of a modified cutter body used for a tip dresser according to one embodiment or the present invention.
Figure 9:
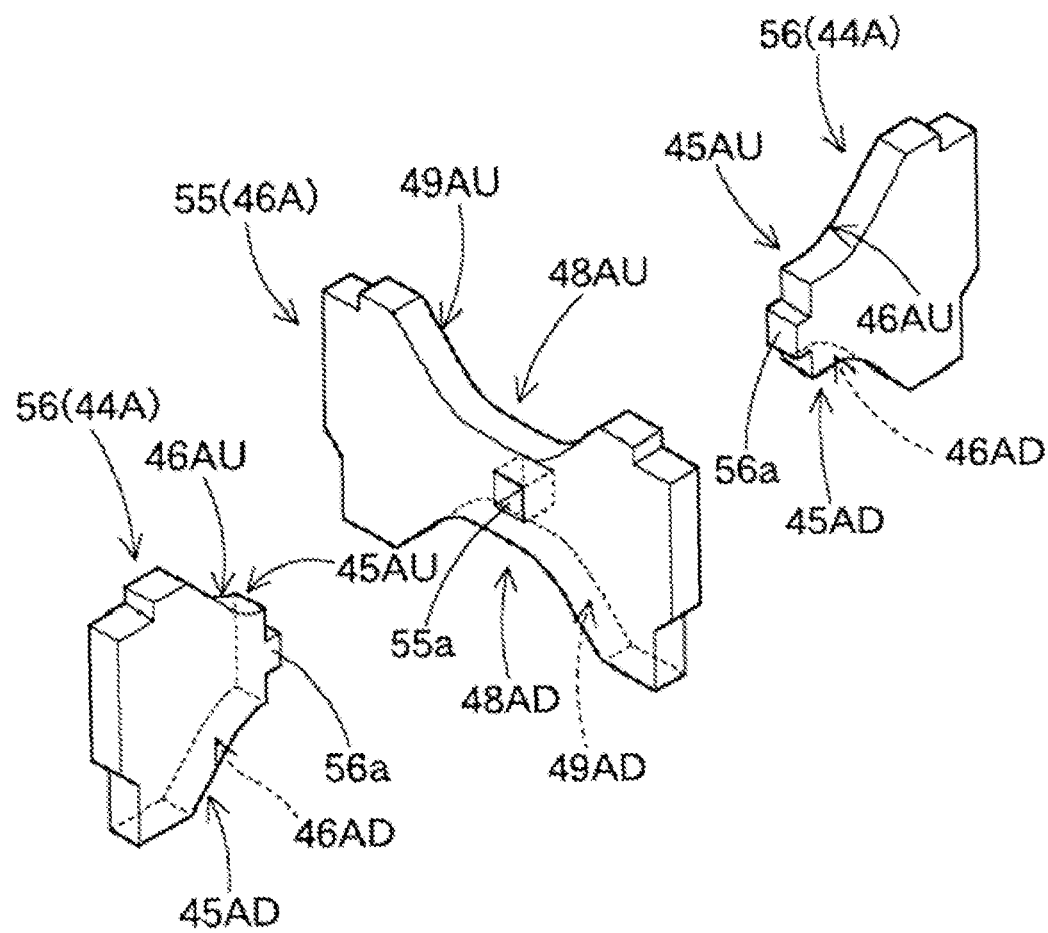
FIG. 9 is an exploded perspective diagram of a cutting blade main material and a cutting blade sub-material configuring the cutter body shown in FIG. 8.

Alternatively, a cutter body 39A, as shown in FIG. 8 and FIG. 9, can include a cut sing blade main member 55 configuring a plate type cutting blade part 47A and a pair of cutting blade sub-members 56 and 56 equally dividing a plate type cutting blade part 44A into two parts in the vicinity of the rotation center axis O.

The cutter body 39A has the same configuration of the former curter body 39 except including the cutting blade main member 55 and a pair of the cutting blade sub-members 56 and 56. And, details of the same members are omitted in a manner of attaching 'A' to an end of the same reference number.

The cutting blade main member 55 is configured to have a shape of a double-headed drum pinched in at the middle, which is formed by cutting a flat panel metal material such as high-speed tool steel and the like using a wire cutter.

And, the cutting blade main member 55 includes a fitting hole portion (fitting portion) 55a perforated in a rectangular shape at a center in width and length directions to enable a fitting protrusion (fitting portion) 56a fried at each of the cutting blade sub-members 56 to be fitted therein.

Each of the cutting blade sub-members 56 is configured to have a shape that divides the plate type cutting blade part 47A into two equal parts in the vicinity of middle. And, each of the cutting blade sub-members 56 is formed by cutting a flat panel metal material such as high-speed tool steel and the like using a wire cutter.

The fitting protrusion 56a, provided as an end portion of the cutting blade sub-member 55 toward the rotation center axis O, for being fitted into the fitting dole portion 55a of the cutting blade main member 55 is provided to the center in the length direction.

And, the cutter body 39A is assembled by fitting the fitting protrusion 56a of each of the cutting blade sub-members 56 into the fitting hole portion 5a of the cutting blade main member 55.

In the above-explained embodiment of the present invention, the fitting protrusion 56a is provided as a fitting portion to each of the cutting blade sub-members 56. And, the fitting hole portion 55a is provided as the fitting portion to the cutting blade main member 55. On the contrary, the fitting hole portion is provided to each of the cutting blade sub-members and the fitting protrusion is provided to the cutting blade main member.

Comparing the cutter bodies 39 and 39A to each other, the cutter body 39A is configured between accommodating concave parts 42AU and 42AD by fitting each of the fitting protrusions 56a of a pair of the cutting blade sub-members 56 into the fitting hole portion 55a of the cutting blade main member 55, whereas the former cutter body 39 is configured between the accommodating concave parts 42U and 42D by fitting the fitting recesses 51 and 52a to each other.

So, it is necessary to secure a numerical value in a length direction between the accommodating concave parts 42AU and 42AD sufficiently.

In particular, compared to the latter cutter body 39A, the former cutter body 39 can have a width in a length direction set smaller than that of the latter cutter body 39A. Preferably, the cutter body 39 is used for the grinding of electrode tips for which a distance between the electrode tips is relatively set small. Preferably, the cutter body 39A is used for the grinding of electrode tips for which a distance between the electrode tips is relatively set large.

Accordingly, the present invention provides the following effects or advantages.

First of all, the present invention facilitates a cutter body to be formed.

Secondly, the present invention enables an end of an electrode tip to be quickly and neatly grinded.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A tip dresser comprising a cutter, the tip dresser configured to grind a pair of electrode tips used for spot welding in a manner of approaching ends of a pair of the electrode tips to each other, the cutter comprising:
   a holder configured to be rotationally driven with a rotation center axis matched to an axial center of each of the mutually approached electrode tips;
   a cutter body retained by the holder to cut vicinities of the ends of electrode tips in case that the holder is rotated, the cutter body configured to cut the vicinities of the electrode tips in case of forward or reverse revolutions of the holder; and
   a discharge hole perforated between the cutter body and the holder along the rotation center axis to discharge cutting particles generated from grinding the ends of the electrode tips,
wherein the cutter body further comprises a pair of accommodating concave parts provided to both edges in a length direction approximate to a direction of approaching a pair of the electrode tips to each other to accommodate the ends of the electrode tips in case of grinding a pair of the electrode tips aligned to oppose each other, respectively,
wherein the cutter body further comprises a pair of recesses configuring a pair of the accommodating concave parts, respectively,
wherein the cutter body further comprises a pair of plate type cutting blade parts, each having a cutting blade at one edge in a direction of a plate thickness becoming a circumferential edge of the corresponding recess, a pair of the plate type cutting blade parts assembled in an approximate cross shape to cross with each other in the vicinity of the rotation center axis,
wherein a crossing point between the cutting blades is located on the rotation center axis,
wherein if the holder is rotated in a forward direction, a portion of one of the cutting blades aligned to spread from the crossing point and a portion of the other cutting blade aligned distant from the crossing point cut the electrode tips, and
wherein if the holder is rotated in a reverse direction, a portion of the other cutting blade aligned to spread from the crossing point and a portion of the former cutting blade aligned distant from the crossing point cut the electrode tips.

2. The tip dresser of claim 1, wherein the cutter body comprises a pair of cutting blade plate mergers configuring the plate type cutting blade parts to have fitting recesses, respectively, wherein the fitting recesses are fitted together at a crossing point between a pair of the cutting blade plate members, and wherein a pair of the cutting blade plate members are assembled together in a manner of fitting the fitting recesses of a pair of the cutting blade plate members to each other.

3. The tip dresser of claim 1, the outer body comprising:
   a cutting blade main member configuring one of the plate type cutting blade parts; and a pair of cutting blade sub-members configuring to divide the other plate type cutting blade part into two parts in the vicinity of the rotation center axis, wherein each of a pair of the cutting blade sub-members is assembled to the cutting blade main member in a manner that a fitting portion provided to the corresponding cutting blade sub-member in the vicinity of the rotation center axis and another fitting portion provided to the cutting blade main member are fitted into each other.

\* \* \* \* \*